United States Patent [19]

Staab

[11] Patent Number: 5,585,739

[45] Date of Patent: Dec. 17, 1996

[54] DOUBLED ENDED SPRING PROBE RING INTERFACE FOR MULTIPLE PIN TEST HEADS AND METHOD THEREFOR

[75] Inventor: Craig C. Staab, Mesa, Ariz.

[73] Assignee: VLSI Technology, Inc., San Jose, Calif.

[21] Appl. No.: 506,154

[22] Filed: Jul. 24, 1995

[51] Int. Cl.⁶ .............. G01R 1/04; H01R 4/58; H01R 9/00; H05K 7/20
[52] U.S. Cl. .......................... 324/761; 324/758
[58] Field of Search ................. 324/761, 758, 324/72.5, 149; 439/320, 268, 392, 403, 190; 200/166; 339/60; 361/386, 387, 388, 389

[56] References Cited

U.S. PATENT DOCUMENTS

| | | | |
|---|---|---|---|
| 3,648,002 | 3/1972 | Du Rocher | 200/166 C |
| 4,252,391 | 2/1981 | Sado | 339/60 R |
| 4,885,662 | 12/1989 | Bartholomew et al. | 361/386 |
| 5,410,260 | 4/1995 | Kazama | 324/758 |
| 5,417,577 | 5/1995 | Holliday et al. | 439/91 |

*Primary Examiner*—Kenneth A. Wieder
*Assistant Examiner*—Barry C. Bowser
*Attorney, Agent, or Firm*—Harry M. Weiss & Associates, P.C.

[57] ABSTRACT

The present invention relates to a double ended spring probe ring interface for multiple pin test heads, such as a 120 pin sentry style test head. The double ended spring probe ring is comprised of a non-conductive ring having a plurality of apertures equally spaced along an outer radius of the ring. A plurality of double-ended spring probes are held in the ring by a holding device which is coupled to each spring probe. The holding device holds the spring probe within the ring so as to maintain coplanarity among the spring probes.

12 Claims, 1 Drawing Sheet

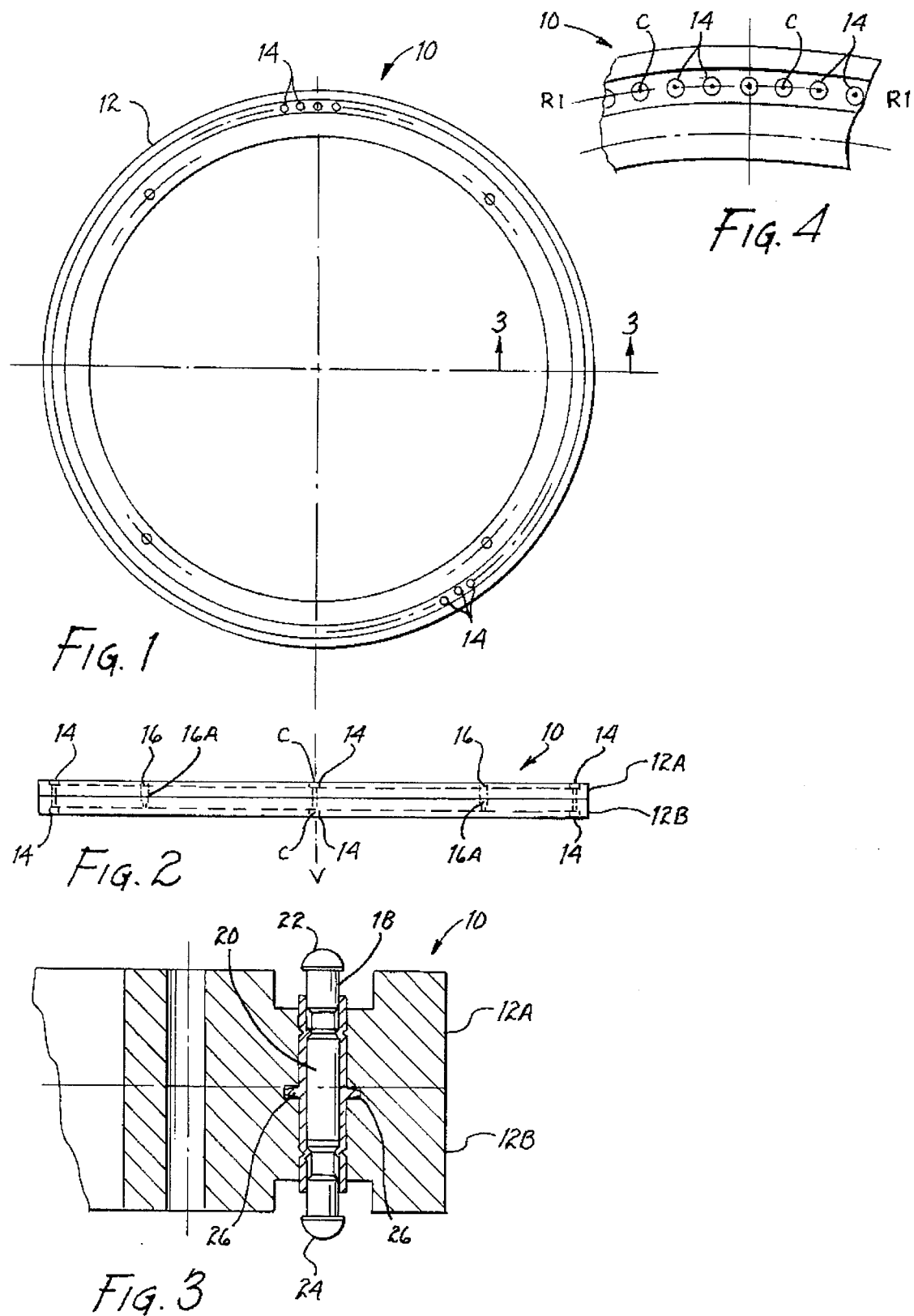

DOUBLED ENDED SPRING PROBE RING INTERFACE FOR MULTIPLE PIN TEST HEADS AND METHOD THEREFOR

BACKGROUND OF THE INVENTION

1. Field of the Invention

This invention relates generally to a ring interface for testing integrated circuits and, more specifically, to a double ended spring probe ring interface for multiple pin test heads, such as 120 pin sentry style test heads.

2. Description of the Prior Art

To interface electrically from a load board to a device under test (DUT) board on multiple pin test heads, there are two rings of etch pads where electrical connections must be made. Currently, the electrical connection is made through a ring interface having a plurality of spring probes, sometimes referred to as pogo pins. Pogo pins are well known in the art. Pogo pins typically have a shaft with a compression portion located at both ends of the shaft. When the ring interface is placed between the load board and the DUT board, the pogo pins are compressed and provide electrical continuity between the two boards.

A major problem with current ring interface is that the pogo pins are coupled to the ring interface by "screwing" the pogo pins into the ring interface. After normal usage of the ring interface, the pogo pins would unscrew themselves from the ring interface. The unscrewing of the pogo pins causes a loss of planarity across the pins (i.e. the top and bottom ends of all of the pogo pins do not lie in spaced-apart horizontal planes) thus causing electrical continuity problems from the load board to the DUT board.

Therefore, a need existed to provide an improved ring interface. The improved ring interface must not lose planarity across the ends of the pogo pins thus causing a loss of electrical continuity from the load board to the DUT board.

SUMMARY OF THE INVENTION

In accordance with one embodiment of the present invention, it is an object of this invention to provide an improved ring interface and method therefor for multiple pin test heads.

It is another object of the present invention to provide and improved ring interface and method therefor for multiple pin test heads that will not lose planarity across the ends of the pogo pins thus causing a loss of electrical continuity from the load board to the DUT board.

BRIEF DESCRIPTION OF THE PREFERRED EMBODIMENTS

In accordance with one embodiment of the present invention, a double ended spring probe interface for multiple pin test heads, such as for 120 pin sentry style test heads is disclosed. The double ended spring probe interface is comprised of a plurality of double ended spring probe means for providing electrical continuity from a load board to a device under test (DUT) board. The spring probe means are held by an electrically non-conductive ring means having a plurality of apertures therethrough. The ring means holds the spring probe means so that the top heads and bottom heads of the plurality of double ended spring probe means are held in spaced-apart horizontal planes.

In accordance with another embodiment of the present invention, a method of providing a double ended spring probe interface for multiple pin test heads, such as 120 pin sentry style test heads is disclosed. The method is comprised of the steps of: providing a plurality of double ended spring probe means for providing electrical continuity from a load board to a DUT board; providing a first electrically non-conductive ring means having a plurality of apertures therethrough equally spaced around a first radius of the first electrically non-conductive ring means for holding the plurality of doubled ended spring probe means so that a top head of each of the plurality of double ended spring probe means all lie in a same horizontal plane; and providing a second electrically non-conductive ring means coupled to the first electrically non-conductive ring means and having a plurality of apertures therethrough equally spaced around a first radius of the second electrically non-conductive ring means for holding the plurality of doubled ended spring probe means so that a bottom head of each of the plurality of double ended spring probe means all lie in a same horizontal plane.

The foregoing and other objects, features, and advantages of the invention will be apparent from the following, more particular, description of the preferred embodiments of the invention, as illustrated in the accompanying drawing.

BRIEF DESCRIPTION OF THE DRAWINGS

FIG. 1 is a top view of the double ended spring probe ring interface of the present invention.

FIG. 2 is a side view of the double ended spring probe ring interface of FIG. 1.

FIG. 3 is a cross-sectional side view of the double ended spring probe ring interface of FIG. 1 taken along lines 3—3.

FIG. 4 is a top sectional view of the double ended spring probe ring interface of FIG. 1.

DETAILED DESCRIPTION OF THE PREFERRED EMBODIMENTS

Referring to FIGS. 1, a double ended spring probe interface for multiple pin test heads 10 (hereinafter spring probe interface 10) is shown. The spring probe interface is comprised of an electrically non-conductive ring 12. In the preferred embodiment of the present invention, the non-conductive ring 12 is made out of teflon. The non-conductive ring 12 has a plurality of apertures 14 located around the perimeter of the non-conductive ring 12. Each of the plurality of apertures 14 are drilled through the non-conductive ring 12 and are used for holding a double ended spring probe (not shown).

Referring to FIG. 4, a sectional view of the spring probe interface 10 is shown. As can be seen from FIG. 4, each of the plurality of apertures 14 has a center C which lies on an outer radius R1 of the non-conductive ring 12. Each aperture is positioned on the non-conductive ring 12 so that each center C of each aperture 14 is an equal distance from a center C of an adjacent aperture 14.

Referring to FIGS. 2, the non-conductive ring 12 is shown to be comprised of an upper non-conductive ring 12A and a lower non-conductive ring 12B. The plurality of apertures 14 are drilled completely through both the upper and lower non-conductive rings 12A, 12B. Each of the plurality of apertures 14 drilled through the upper non-conductive ring 12A has a corresponding aperture 14 drilled through the lower non-conductive ring 12B. The upper and lower rings 12A, 12B are then coupled together so that a center C of an aperture 14 drilled through the upper non-conductive ring 12A lies in the same vertical plane V as a center C of a corresponding aperture 14 drilled through the lower non-conductive ring 12B. The upper and lower non-conductive rings 12A, 12B also contain a plurality of bolt holes 16. Each of the plurality of bolt holes 16 being located on the same radius. The bolt holes 16 are used for coupling the upper and lower non-conductive rings 12A, 12B together by a plurality of bolts 16A.

Referring to FIG. 3, a cross-sectional view of the spring probe interface 10 is shown. As can be seen from FIG. 3, each aperture 14 holds a double ended spring probe 18 (hereinafter spring probe 18). The spring probe 18 is comprised of a spring shaft 20 with a compression portion located at both the top 22 and the bottom 24 of the spring shaft 20. The apertures are drilled so as to hold the top compression portion 22 of each spring probe 18 in the same horizontal plane, as well as for holding the bottom compression portion 24 of each spring probe 18 in the same horizontal plane.

The spring probes are further held in position in the upper and lower non-conductive rings 12A, 12B by a holding device 26 which is coupled to the spring shaft 20 of each spring probe 18. The holding device 26 works in combination with the apertures 14 to hold the top compression portion 22 of each spring probe 18 in the same horizontal plane, as well as for holding the bottom compression portion 24 of each spring probe 18 in the same horizontal plane. Each aperture 14 drilled through the lower non-conductive ring 12B is comprised of a first cylindrical portion having a first width and a first depth, and a second cylindrical portion having a second width and a second depth. The first width of each aperture is larger than the second width, and the first depth of each aperture is smaller than the second depth. The first width and the first depth of each aperture are drilled so as to cradle the holding device 26 in the lower non-conductive ring 12B. When the upper non-conductive ring 12A is coupled to the lower non-conductive ring 12B, the holding device 26 holds the spring probe 18 so that the top compression portion 22 of each spring probe 18 lie in the same horizontal plane, and the bottom compression portion 24 of each spring probe 18 lie in the same horizontal plane.

While the invention has been particularly shown and described with reference to preferred embodiments thereof, it will be understood by those skilled in the art that the foregoing and other changes in form and details may be made therein without departing from the spirit and scope of the invention.

I claim:

1. A double ended spring probe interface for multiple pin test heads, such as for a 120 pin sentry style test heads comprising, in combination:

a plurality of double ended spring probe means for providing electrical continuity from a load board to a device under test (DUT) board;

electrically non-conductive ring means having a plurality of apertures therethrough for holding top heads and bottom heads of said plurality of double ended spring probe means in spaced-apart horizontal planes, each of said apertures having a center which lies on an outer radius of said electrically non-conductive ring means and each center of said each of said apertures being an equal distance from a center of an adjacent aperture.

2. A double ended spring probe interface for multiple pin test heads, such as for a 120 pin sentry style test heads comprising, in combination:

a plurality of double ended spring probe means for providing electrical continuity from a load board to a device under test (DUT) board;

first electrically non-conductive ring means having a plurality of apertures therethrough equally spaced around a first radius of said first electrically non-conductive ring means for holding said plurality of double ended spring probe means so that a top head of each of said plurality of double ended spring probe means all lie in a same horizontal plane;

second electrically non-conductive ring means coupled to said first electrically non-conductive ring means and having a plurality of apertures therethrough equally spaced around a first radius of said second electrically non-conductive ring means and coaxial with said plurality of apertures of said first electrically non-conductive ring means for holding said plurality of double ended spring probe means so that a bottom head of each of said plurality of double ended spring probe means all lie in a same horizontal plane; and securing means coupled to a center portion of each of said plurality of double ended spring probe means for holding each of said plurality of double ended spring probe means in said first and second electrically non-conductive ring means so that said tog head of said plurality of double ended spring probe means all lie in a same horizontal plane and said bottom head of each of said plurality of double ended spring probe means all lie in a same horizontal plane.

3. A double ended spring probe interface in accordance with claim 2 wherein said first electrically non-conductive ring means is made out of teflon.

4. A double ended spring probe interface in accordance with claim 2 wherein said second electrically non-conductive ring means is made out of teflon.

5. A double ended spring probe interface in accordance with claim 2 wherein said plurality of apertures of said second electrically non-conductive ring means comprises a first cylindrical portion having a first width and a first depth and comprising a second cylindrical portion having a second width and a second depth, said first width being larger than said second width, and said first depth being smaller than said second depth, said first width and said first depth of said plurality of apertures of said second electrically non-conductive ring means are for holding said securing means of said plurality of double ended spring probe means.

6. A double ended spring probe interface in accordance with claim 2 further comprising:

a plurality of bolt holes located around a second radius of said first electrically non-conductive ring means; and a plurality of bolt holes located around a second radius of said second electrically non-conductive ring means, said plurality of bolt holes located around said second radius of said second electrically non-conductive ring means having a same radius and being in alignment with said plurality of bolt holes located around said second radius of said first electrically non-conductive ring means so that a plurality of bolts may be used to secure said first electrically non-conductive ring means to said second electrically non-conductive ring means.

7. A double ended spring probe interface for multiple pin test heads, such as 120 pin sentry style test heads comprising, in combination:

a plurality of double ended spring probe means for providing electrical continuity from a load board to a device under test (DUT) board;

securing means coupled to a center portion of each of said plurality of double ended spring probe means for ensuring coplanarity of said plurality of double ended spring probe means;

a first electrically non-conductive ring means having a plurality of apertures therethrough equally spaced around a first radius of said first electrically non-conductive ring means for holding said plurality of doubled ended spring probe means so that a top head of each of said plurality of double ended spring probe means all lie in a same horizontal plane;

a second electrically non-conductive ring means coupled to said first electrically non-conductive ring means and having a plurality of apertures therethrough equally spaced around a first radius of said second electrically non-conductive ring means for holding said plurality of doubled ended spring probe means so that a bottom head of each of said plurality of double ended spring probe means all lie in a same horizontal plane, said plurality of apertures of said second electrically non-conductive ring means comprising a first cylindrical portion having a first width and a first depth and comprising a second cylindrical portion having a second width and a second depth, said first width being larger than said second width, and said first depth being smaller than said second depth, said first width and said first depth of said plurality of apertures of said second electrically non-conductive ring means are for holding said securing means coupled to said plurality of double ended spring probe means;

a plurality of bolt holes located around a second radius of said first electrically non-conductive ring means; and a plurality of bolt holes located around a second radius of said second electrically non-conductive ring means, said plurality of bolt holes located around a second radius of said second electrically non-conductive ring means having a same radius and being in alignment with said plurality of bolt holes located around said second radius of said first electrically non-conductive ring means so that a plurality of bolts may secure said first electrically non-conductive ring means to said second electrically non-conductive ring means.

8. A method of providing a double ended spring probe interface for multiple pin test heads, such as for a 120 pin sentry style test heads comprising the steps of:

providing a plurality of double ended spring probe means for providing electrical continuity from a load board to a device under test (DUT) board;

providing first electrically non-conductive ring means having a plurality of apertures therethrough equally spaced around a first radius of said first electrically non-conductive ring means for holding said plurality of double ended spring probe means so that a top head of each of said plurality of double ended spring probe means all lie in a same horizontal plane;

providing second electrically non-conductive ring means coupled to said first electrically non-conductive ring means and having a plurality of apertures therethrough equally spaced around a first radius of said second electrically non-conductive ring means and coaxial with said plurality of apertures of said first electrically non-conductive ring means for holding said plurality of double ended spring probe means so that a bottom head of each of said plurality of double ended spring probe means all lie in a same horizontal plane; and providing securing means coupled to a center portion of each of said plurality of double ended spring probe means for holding each of said plurality of double ended spring probe means in said first and second electrically non-conductive ring means so that said top head of said plurality of double ended spring probe means all lie in a same horizontal plane and said bottom head of each of said plurality of double ended spring probe means all lie in a same horizontal plane.

9. The method of claim 8 wherein said step of providing first electrically non-conductive ring means further comprises the step of providing said first electrically non-conductive ring means made out of teflon.

10. The method of claim 8 wherein said step of providing second electrically non-conductive ring means further comprises the step of providing said second electrically non-conductive ring means made out of teflon.

11. The method of claim 8 further comprising the step of providing said plurality of apertures of said second electrically non-conductive ring means having a first cylindrical portion having a first width and a first depth and having a second cylindrical portion having a second width and a second depth, said first width being larger than said second width, and said first depth being smaller than said second depth, said first width and said first depth of said plurality of apertures of said second electrically non-conductive ring means are for holding said securing means of said plurality of double ended spring probe means.

12. The method of claim 8 further comprising the steps of:

providing a plurality of bolt holes located around a second radius of said first electrically non-conductive ring means; and providing a plurality of bolt holes located around a second radius of said second electrically non-conductive ring means, said plurality of bolt holes located around said second radius of said second electrically non-conductive ring means having said same radius and being in alignment with said plurality of bolt holes located around a second radius of said first electrically non-conductive ring means so that a plurality of bolts may secure said first electrically non-conductive ring means to said second electrically non-conductive ring means.

* * * * *